United States Patent
Masuda et al.

(10) Patent No.: US 7,563,487 B2
(45) Date of Patent: *Jul. 21, 2009

(54) ANISOTROPIC ELECTRICALLY CONDUCTIVE FILM AND METHOD OF PRODUCING THE SAME

(75) Inventors: Yasuhito Masuda, Osaka (JP); Yasuhiro Okuda, Osaka (JP); Fumihiro Hayashi, Osaka (JP); Tsuyoshi Haga, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 666 days.

This patent is subject to a terminal disclaimer.

(21) Appl. No.: 10/551,459

(22) PCT Filed: Mar. 12, 2004

(86) PCT No.: PCT/JP2004/003356

§ 371 (c)(1),
(2), (4) Date: Sep. 30, 2005

(87) PCT Pub. No.: WO2004/088795

PCT Pub. Date: Oct. 14, 2004

(65) Prior Publication Data

US 2006/0251871 A1 Nov. 9, 2006

(30) Foreign Application Priority Data

Mar. 31, 2003 (JP) .............................. 2003-096173

(51) Int. Cl.
*B05D 1/00* (2006.01)
*B05D 1/18* (2006.01)

(52) U.S. Cl. .................. 427/437; 427/209; 427/560

(58) Field of Classification Search ................. None
See application file for complete search history.

(56) References Cited

U.S. PATENT DOCUMENTS 4,719,145 A * 1/1988 Neely .......................... 428/327
5,087,641 A * 2/1992 Sato ............................ 521/53

(Continued)

FOREIGN PATENT DOCUMENTS

EP 0 726 621 A2 8/1996

(Continued)

OTHER PUBLICATIONS

Translation of International Preliminary Report on Patentability issued in corresponding International Application No. PCT/JP2004/003356, mailed Mar. 2, 2006.

(Continued)

*Primary Examiner*—Shamim Ahmed
(74) *Attorney, Agent, or Firm*—McDermott Will & Emery LLP

(57) ABSTRACT

The present invention is directed to an anisotropic conductive film and manufacturing methods thereof, in which an electrically insulative porous film made of synthetic resin is used as a base film and in which conductive parts capable of being provided with conductiveness in the film thickness direction are formed independently at plural positions of the base film by adhering conductive metal to resinous parts of porous structure in such a manner as piercing through from a first surface to a second surface.

2 Claims, 4 Drawing Sheets

U.S. PATENT DOCUMENTS

| | | | | |
|---|---|---|---|---|
| 5,591,285 | A | * | 1/1997 | Afzali-Ardakani et al. . 156/62.2 |
| 5,834,112 | A | * | 11/1998 | Muraoka et al. ............ 428/332 |
| 5,900,197 | A | * | 5/1999 | Matsui et al. ................. 264/49 |
| 6,333,589 | B1 | * | 12/2001 | Inoi et al. .................... 310/358 |
| 2002/0029906 | A1 | * | 3/2002 | Echigo et al. ............... 174/265 |
| 2006/0141159 | A1 | * | 6/2006 | Okuda et al. ................ 427/331 |

FOREIGN PATENT DOCUMENTS

| | | | |
|---|---|---|---|
| EP | 0 918 371 | A1 | 5/1999 |
| JP | 42-13560 | B | 8/1942 |
| JP | 56-121202 | A | 9/1981 |
| JP | 63-58708 | A | 3/1988 |
| JP | 5-102659 | A | 4/1993 |
| JP | 7-207450 | | 8/1995 |
| JP | 10-12673 | A | 1/1998 |
| JP | 10-503320 | A | 3/1998 |
| JP | 11-204177 | A | 7/1999 |
| JP | 2003-022849 | * | 1/2003 |
| JP | 2003-22849 | A | 1/2003 |
| JP | 2003-059611 | * | 2/2003 |
| JP | 2003-59611 | A | 2/2003 |
| JP | 2003059611 | A * | 2/2003 |
| WO | WO 9603757 | A1 | 2/1996 |
| WO | WO 97/13295 | | 4/1997 |

OTHER PUBLICATIONS

Japanese Office Action, with English translation, issued in Japanese Patent Application No. JP 2003-096173, mailed Jul. 24, 2007.

European Search Report issued in European Patent Application No. EP 04 72 0240, mailed Oct. 18, 2007.

* cited by examiner

ANISOTROPIC ELECTRICALLY CONDUCTIVE FILM AND METHOD OF PRODUCING THE SAME

This application is the U.S. National Phase under 35 U.S.C. § 371 of International Application No. PCT/JP2004/003356, filed Mar. 12, 2004, which in turn claims the benefit of Japanese Application No. 2003-096173, filed Mar. 31, 2003, the disclosures of which Applications are incorporated by reference herein in their entirety.

TECHNICAL FIELD

The present invention relates to an anisotropic conductive film and the manufacturing method thereof, and more particularly to an anisotropic conductive film suitable for use in the burn-in test of semiconductor devices and the manufacturing method thereof.

BACKGROUND ART

A burn-in test is performed as one of screening techniques for removing an initial failure of semiconductor devices. In the burn-in test, accelerated stress that is higher in temperature and pressure than that of the operation condition of the semiconductor devices is applied, thereby accelerating the occurrence of failures so that defective products can be removed in a short time. For example, a number of semiconductor devices that have been packaged are arranged on a burn-in board, and a supply voltage and input signal to be accelerated stress are applied in a high temperature bath for a given time. Thereafter, the semiconductor devices are removed outside, and judgment tests are performed as to acceptability in terms of their quality. In the judgment tests, judgments are done with respect to an increase of leakage current due to flaw of a semiconductor device, a defective product due to flaw in the multilayer interconnection, failure in the contact, and so on. A burn-in test is performed also in the state of a semiconductor wafer.

When the burn-in test of a semiconductor wafer is performed, for example, the test is done through an electrode pad made of aluminum on the semiconductor wafer surface. In such case, in order to make up for contact deficiency due to variations in the electrode height between the electrode pad of the semiconductor wafer and the head electrode of the measurement equipment, a contact sheet having conductiveness only in the film thickness direction is put usually between theses electrodes so that the examination can be accomplished. This contact sheet is called an anisotropic conductive film (or "an anisotropic conductive sheet") because of the characteristic that the conductiveness is exhibited only in the film thickness direction at a conductive part (which is also called "an electrically conductive path" or "electrode part") arranged according to the pattern that corresponds to a surface electrode.

In the field of electronics technology in the past, an anisotropic electrically conductive part 61 as shown in FIG. 6 has been known for the purpose of connecting a packaged integrated circuit with a printed circuit board. In the anisotropic electrically conductive part 61, conductive parts 62 are formed such that a flat porous flexible material 63 is used as an insulation part of non-conductiveness, and such that a conductive metal is filled in a section demarcated at least in one vertical direction (Z-axis direction) and is fixed with an adhesive of epoxy resin or the like. An example of such anisotropic electrically conductive parts is described in Japanese translation of PCT international application No. 10-503320. However, this anisotropic electrically conductive part 61 is not suitable for an anisotropic conductive film used in a burn-in test in which repeated use is needed. When the anisotropic electrically conductive part 61 is used as an anisotropic conductive film for the burn-in test, the conductive parts 62 are buckled by pressing applied during inspection and are unable to exhibit elastic recovery. Therefore, they must be discarded once they are used in an inspection. This results in costly inspection.

Also, Japanese Patent Application Publication No. 10-12673 discloses a sheet 71 for mounting semiconductor device. The sheet 71 is structured such that, as shown in FIG. 7, electrically conductive paths 72 are formed by providing a plurality of through-holes in an insulation sheet for sealing 74 in the film thickness direction thereof, which sheet is made of thermoset resin such as an epoxy resin material, and by filling the through-holes with an electrically conductive path material which is formed in a manner such that electrically conductive particles 73 are dispersed in an elastomer. The electrically conductive particles that are used in such case are, for example, metal or alloy particles, or capsule-type electrically conductive particles having a structure in which a conductive metal is plated on the surfaces of polymer particles.

When the sheet 71 for mounting a semiconductor device is pressed in the film thickness direction, the elastomer of electrically conductive paths 72 is compressed such that the electrically conductive particles 73 are connected together so that electrical continuity is obtained only in the film thickness direction of the electrically conductive path. However, when the sheet 71 for mounting a semiconductor device is used for a burn-in test, the anisotropic conductive film needs a high compressive load to achieve conductiveness in the film thickness direction and moreover the elasticity thereof deteriorates with the deterioration of the elastomer. Accordingly, it is not possible to use the sheet 71 repeatedly in a burn-in test. Therefore, the sheet having such structure for mounting a semiconductor device is not suitable for an anisotropic conductive film used in a burn-in test of semiconductor wafers and the like.

On the other hand, an anisotropic conductive film which is used as an interposer for the burn-in test of semiconductor wafers is required to have a function of stress relaxation in addition to a function of connecting a surface electrode of the semiconductor wafer with a head electrode of measurement equipment and connecting a wiring from the semiconductor wafer with a terminal of a semiconductor package, and so on. Therefore, the anisotropic conductive film must have elasticity in the film thickness direction so as to be able to have conductiveness in the film thickness direction at a low compression load, and in addition, must have a property of elastic recovery suitable for repeated use. Also, it is demanded that the pattern of the size and pitch of conductive parts of the anisotropic conductive film to be used in the inspection be made finer in accordance with high density packaging. However, according to conventional techniques, anisotropic conductive films that can meet these requirements sufficiently could not be developed.

DISCLOSURE OF THE INVENTION

An object of the present invention is to provide anisotropic conductive films which are mainly used for an inspection of semiconductor wafers and which are elastic in the film thickness direction so that conductiveness in the film thickness direction can be afforded with a low compression load. Another object of the present invention is to provide anisotropic conductive films in which the sizes and pitches of conductive parts can be made finer.

In the course of research and study for achieving the objects, the present inventors aimed at an electrically insulative porous film made of synthetic resin since it had elasticity suitable for elastic recovery and was suitable as a base film of anisotropic conductive film. However, in the case of the porous film having conductive parts provided by filling conductive metal in the porous structure of specific parts thereof, the electrically conductive metal lump buckles and does not make elastic recovery when a compressive load is applied. Therefore, the porous film thus formed cannot be used repeatedly.

Thus, as a result of continued research, it was found that the porous structure in conductive parts could be maintained in the case where the conductive parts were formed by making conductive metal to adhere to the resinous parts of porous structure at plural positions of the porous film in a manner such as piercing through in the thickness direction. Although the original porous structure of the porous film cannot be maintained completely in the conductive parts because of the conductive metal adhering to the resinous parts of porous structure, it is possible to maintain the porous structure to some degree. That is, in an anisotropic conductive film of the present invention, the conductive parts are of porous structure.

Therefore, the anisotropic conductive film of the present invention has elastic recovery property upon compression as well as elasticity, not only in the base film but also in the conductive parts, and can be applied to repeated use. Also, the anisotropic conductive film of the present invention can be made conductive in the film thickness direction at a low compression load. Moreover, in the anisotropic conductive film of the present invention, the conductive parts and pitches between the conductive parts can be made finer. Thus, the present invention has been completed based on such discovery and knowledge.

An anisotropic conductive film is provided according to the present invention, wherein an electrically insulative porous film made of synthetic resin is used as a base film and conductive metal plating particles are formed continuously adhering to the resinous parts of porous structure in the wall surfaces of through-holes piercing from a first surface to a second surface at plural positions of the base film, whereby conductive parts which can be provided with conductiveness in the film thickness direction are provided independently in a manner such that the conductive parts maintain the porous structure of the porous film.

Also, a method of making an anisotropic conductive film is provided according to the present invention, wherein conductive metal particles formed by plating are adhered continuously to the resinous parts of porous structure in the wall surface of the through-holes piercing through from a first surface to a second surface at plural positions of a base film made of an electrically insulative porous film formed synthetic resin, whereby conductive parts which can be provided with conductiveness in the film thickness direction are provided independently in a manner such that the conductive parts maintain the porous structure of the porous film.

Moreover, according to the present invention, the following methods 1-3 of manufacturing anisotropic conductive films are provided:

1. A method of manufacturing an anisotropic conductive film, which method is characterized in that conductive parts capable of being afforded with conductiveness in the film thickness direction are provided independently of each other by adhering conductive metal particles of electroless plating continuously to the resinous parts of porous structure in the wall surfaces of through-holes piercing through from a first surface to a second surface at plural positions of a base film made of an porous polytetrafluoroethylene film formed from synthetic resin, wherein the conductive parts maintain the porous structure of the porous film, the method comprises:

(1) a step of forming a three layer laminated body by fusion-bonding polytetrafluoroethylene films (B) and (C), which are to be mask layers, to both surfaces of a base film consisting of a porous polytetrafluoroethylene film (A);

(2) a step of forming through-holes arranged in a pre-determined pattern in the laminated body by irradiating the surface of one of the mask layers with synchrotron radiation rays or laser beams having a wavelength of 250 nm or less through a light shielding sheet having a plurality of optically transparent parts provided independently of each other in the pre-determined pattern;

(3) a step of adhering catalytic particles for facilitating chemical reduction reaction to resinous parts of porous structure existing in the whole surface, including the wall surfaces of the through-holes, of the laminated body;

(4) a step of peeling off the mask layers from both surfaces of the base film; and (5) a step of adhering conductive metal particles by electroless plating continuously to resinous parts having porous structure in the wall surfaces of the through-holes in a manner such that the conductive parts maintain the porous structure of the porous films.

2. A method of manufacturing an anisotropic conductive film, which method is characterized in that conductive parts capable of being afforded with conductiveness in the film thickness direction are provided independently of each other by adhering conductive metal particles of electroless plating continuously to the resinous parts of porous structure in the wall surfaces of through-holes piercing through from a first surface to a second surface at plural positions of a base film made of an porous polytetrafluoroethylene film formed from synthetic resin, wherein the conductive parts maintain the porous structure of the porous film, the method comprises:

(I) a step of forming a three layer laminated body by fusion-bonding polytetrafluoroethylene films (B) and (C) as mask layers to both surfaces of a base film consisting of a porous polytetrafluoroethylene film (A);

(II) a step of forming through-holes by using an ultrasonic head having at least one rod at the tip thereof and pressing the tip of the rod so as to apply ultrasonic wave energy to the surface of the laminated body, the through-holes being arranged in a pattern in the laminated body;

(III) a step of adhering catalytic particles for facilitating chemical reduction reaction to resinous parts of porous structure existing in the whole surface, including the wall surfaces of the through-holes, of the laminated body;

(IV) a step of peeling off the mask layers from both surfaces of the base film; and (V) a step of adhering conductive metal by electroless plating to resinous parts having porous structure in the wall surfaces of the through-holes in a manner such that the conductive parts maintain the porous structure of the porous film.

3. A method of manufacturing an anisotropic conductive film, which method is characterized in that conductive parts capable of being afforded with conductiveness respectively in the film thickness direction are provided independently of each other in a piercing manner from a first surface to a second surface by adhering conductive metal to resinous parts having porous structure at plural positions in a base film made of a porous polytetrafluoroethylene film, wherein the method comprises:

(i) a step of forming a three layer laminated body by fusion-bonding polytetrafluoroethylene films (B) and (C) as mask layers to both surfaces of a base film consisting of a porous polytetrafluoroethylene film (A);

(ii) a step of infiltrating liquid into porous parts of the laminated body and freezing the liquid;

(iii) a step of forming through-holes in a pattern in the laminated body by using an ultrasonic head having at least one rod at the tip thereof and pressing the surface of the laminated body with the tip of the rod so as to apply ultrasonic wave energy thereto;

(iv) a step of returning the freezing in the porous parts to liquid by increasing the temperature of the laminated body and removing the liquid;

(v) a step of adhering catalytic particles for facilitating chemical reduction reaction to resinous parts of porous structure existing in the whole surface, including the wall surfaces of the through-holes, of the laminated body;

(vi) a step of peeling off the mask layers from both surfaces of the base film; and (vii) a step of adhering conductive metal by electroless plating to resinous parts having porous structure on the wall surfaces of the through-holes.

According to the present invention, it is possible to provide an anisotropic conductive film which has elasticity in the film thickness direction and in which conduction can be afforded in the film thickness direction with a low compression load, and moreover which is capable of elastic recovery and suitable for repeated use. Also, an anisotropic conductive film in which the sizes and pitches of the respective conductive parts can be made finer is provided according to the present invention. The anisotropic conductive film of the present invention is capable of exhibiting electrical continuity in the film thickness direction with a low compression load, and is an anisotropic conductive film mainly suitable for an inspection of semiconductor wafers and the like, and moreover even with repeated application of load, the film thickness thereof can recover because of elasticity, thereby allowing repeated use for the inspection.

BEST MODE FOR CARRYING OUT THE INVENTION

Figure 1:
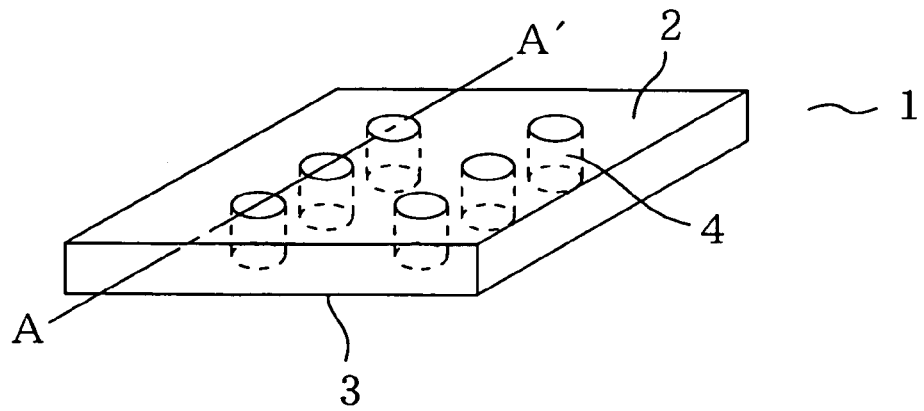
FIG. 1 is a perspective view of a porous film in which through-holes are formed.

1. Porous Film (Base Film);

It is preferable that an anisotropic conductive film for a burn-in test of semiconductor wafers or the like be superior with respect to the heat resistance of the base film. It is necessary for the anisotropic conductive film to have electrical insulation property in the transverse direction (that is, direction perpendicular to the film thickness direction). Therefore, the synthetic resin for forming a porous film must have an electrical insulation property.

The examples of synthetic resin materials for forming a porous film that can be used as the base film are fluororesins such as polytetrafluoroethylene (PTFE), tetrafluoroethylene-hexafluoropropylene copolymer (FEP), tetrafluoroethylene-perfluoroalkylvinylether copolymer (PFA), polyvinylidene fluoride (PVDF), polyvinylidene fluoride copolymer, ethylene-tetrafluoroethylene copolymer (ETFE resin); and engineering plastics such as polyimide (PI), polyamide-imide (PAI), polyamide (PA), polyphenylene ether (mPPE), polyphenylenesulfide (PPS), poly ether ether ketone (PEEK), polysulfone (PSU), polyethersulfone (PES), liquid crystal polymer (LCP); and so on. Among these materials, polytetrafluoroethylene is particularly preferable from the viewpoints of heat resistance, processability, mechanical characteristics, dielectric property and the like.

The methods of preparing the porous film consisting of synthetic resin are, for example, drilling, phase separation, solvent extraction, expanding, and laser irradiation. By forming the porous film using synthetic resin, it is possible to provide elasticity in the film thickness direction and to further decrease permittivity.

The porous film used as a base film of the anisotropic conductive film preferably has a porosity of about 20-80%. The porous film preferably has a mean hole diameter equal to or less than 10 μm or a bubble point equal to or more than 2 kPa, and more preferably a mean hole diameter equal to or less than 1 μm or bubble point equal to or more than 10 kPa from the viewpoint of making the pitch of conductive parts finer. The film thickness of the porous film may be selected discretionally according to the purpose and position of the use, and is generally equal to or less than 3 mm, preferably equal to or less than 1 mm. Particularly, the film thickness of the porous film in an anisotropic conductive film for a burn-in test is preferably about 5-500 μm in many cases, more preferably about 10-200 μm, and most preferably about 15-100 μm.

Among various porous films, a porous polytetrafluoroethylene film (hereinafter, abbreviated to "porous PTFE film") which is obtained by the expansion method is a material that is most suitable as a base film of the anisotropic conductive film because it is easy to obtain a porous film that is not only superior in terms of heat resistance, processability, mechanical characteristics, dielectric property, etc. but also has a uniform pore size distribution.

The porous PTFE film used in the present invention can be manufactured by the method described in Japanese Patent Application Publication No. S42-13560B, for example. First, liquid lubricant is mixed with unsintered PTFE powder and the resulting mixture is pressed into a tubular or planar shape by ram extruding. If a sheet having a thin thickness is to be obtained, the rolling of a planar body is performed by a reduction roll. After the extruding or rolling process, the liquid lubricant is removed from the extruded or rolled product if necessary. The extruded or rolled product thus obtained is expanded at least in one axial direction so that an unsintered porous polytetrafluoroethylene film can be obtained. If the unsintered porous PTFE film is heated to a temperature equal to or more than 327° C., which is the melting point of polytetrafluoroethylene, and is sintered and solidified in such expanded state while it is fixed so as to prevent the contraction thereof, an extremely high-strength porous PTFE film is obtained. When the porous PTFE film is tubular, the tubular film can be made a flat film by cutting it open.

The porous PTFE film obtained by the expanding method has a micro fibrous structure consisting of very thin fibers (fibrils) and knots (nodes) connected together by the fibrils. In the porous PTFE film, the micro fibrous structure forms a porous structure.

2. The Formation of Conductive Parts (Electrode Parts):

In the present invention, conductive metal is adhered to resinous parts of porous structure in a piercing manner from a first surface to a second surface at plural positions of a base film consisting of an electrically insulative porous film formed from a synthetic resin so that conductive parts capable of being afforded with conductiveness in the film thickness direction can be provided independently of each other.

In order to form the conductive parts at plural positions in the base film, first, the positions where the conductive metal are to be adhered must be specified. In one method for specifying the positions to which conductive metal are to be adhered, for example, a porous film is impregnated with liquid resist and exposed in a pattern so as to be developed such that parts where the resist has been removed (hereinafter, "resist-removed parts") are determined to be the positions where conductive metal is to be adhered. In a preferable method of determining the positions of conductive metal adhesion according to the present invention, minute through holes may be formed in the film thickness direction at specific positions of the porous film and the wall surfaces of the through holes may be used as the positions where conductive metal is to be adhered. As compared with the former method in which a photolithography technique is used, the method of the present invention in which a number of through holes are formed in a porous film is suitable in the case where conductive metal is adhered at a fine pitch. The method of forming a number of through holes in the porous film is also suitable for forming conductive parts with minute diameters of equal to or less than 30 μm, and further equal to or less than 25 μm, for example.

In the present invention, conductive parts are formed by adhering conductive metal to resinous parts of porous structure in a piercing manner from a first surface to a second surface at plural positions in a base film consisting of a porous film. In the method of using a photolithography technique, conductive metal particles are deposited on resist-removed parts by an electroless plating method or the like so that the conductive metal may continuously adhere to the resinous parts of porous structure. In this case, the conductive metal is adhered to the resinous parts of porous structure continuously in a piercing manner from a first surface to a second surface at the resist-removed parts. In the peculiar method of the present invention in which through holes are formed, conductive metal particles are deposited by an electroless plating method or the like so as to adhere to the exposed resinous parts of porous structure in the walls of the through holes.

The term "resinous part of porous structure" means a framework forming the porous structure of a porous film. The shape of the resinous part of porous structure differs depending on the kind of the porous film and the method of forming the porous film. For example, in the case of a porous PTFE film by the expansion method, the resinous parts are fibrils and nodes since the porous structure consists of a number of fibrils and a number of nodes connected to each other by the fibrils.

The conductive parts are formed by adhering conductive metal to the resinous parts of porous structure. In this case, by controlling the adhesion quantity of conductive metal appropriately, the porous structure can be maintained in the conductive parts. In the anisotropic conductive film of the present invention, since the conductive metal is adhered along the surfaces of the resinous parts of porous structure, the conductive metal layers become porous integrated with the porous structure, and consequently it may be said that the conductive parts are porous.

When the electroless plating method or the like is adopted, the conductive metal particles adhere to the resinous parts of porous structure. In the anisotropic conductive film of the present invention, the conductive metal particles can be adhered in a state where the porous structure (porousness) which constitutes a porous film is maintained to some degree. The thickness of the resinous part of porous structure (for example, the thickness of a fibril) is preferably equal to or less than 50 μm. The particle diameter of the conductive metal particles is preferably about 0.001-5 μm. The adhesion quantity of the conductive metal particles is preferably about 0.01-4.0 g/ml (resin) to maintain porousness and elasticity. If the adhesion quantity of the conductive metal particles is excessive, depending on the porosity of the porous film to be used as a base film, the elasticity of the anisotropic conductive film increases excessively, and in the case of usually used compressive load, the elastic recovery performance of the anisotropic conductive film deteriorates significantly. If the adhesion quantity of the conductive metal particles is too scarce, it is difficult to achieve electrical connection in the film thickness direction by applying the compressive load.

Figure 2:
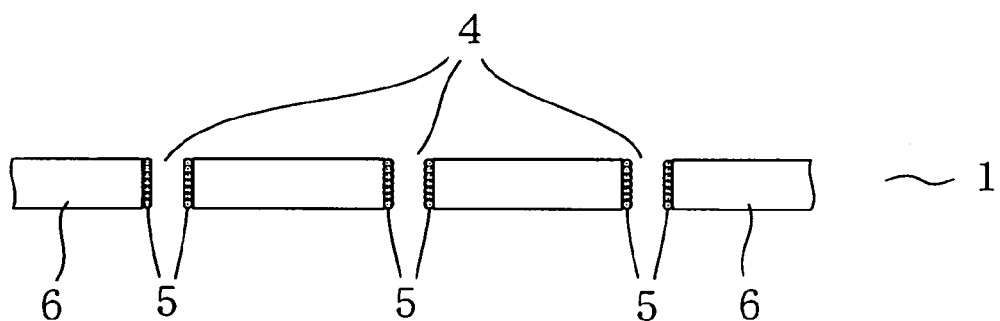
FIG. 2 is a sectional view illustrating a condition in which conductive parts are formed with conductive metal particles adhered to the resinous part of porous structure on the respective walls of through-holes in an anisotropic conductive film of the present invention.

The method of adhering the conductive metal to the resinous part of porous structure in the wall surfaces of the through holes will be described while referring to the drawings. FIG. 1 is a perspective view of a porous film in which through holes are formed. A plurality of through holes 4 that pierce from a first surface 2 to a second surface 3 are formed in the porous film (base film) 1. These through holes are generally formed in a given pattern in the porous film. FIG. 2, which is a sectional view taken along the line A-A' of FIG. 1, illustrates a state in which conductive parts are formed with conductive metal particles adhering to the resinous parts of porous structure in the wall surfaces of the through holes. In FIG. 2, the porous film 6, which is a base film, is provided with through holes 4 at a plurality of pre-determined positions, and conductive parts 5 are formed with conductive metal particles adhered to the resinous parts of porous structure in the walls of through holes. The conductive parts have characteristics as porous structure since they are formed adhering to the surfaces of the resinous parts of porous structure, and consequently conductiveness can be given only in the film thickness direction by applying pressure (compressive load) in the film thickness direction. Since the whole anisotropic conductive film including conductive parts accomplish elastic recovery when the pressure is removed, the anisotropic conductive film of the present invention can be repeatedly used.

Figure 3:
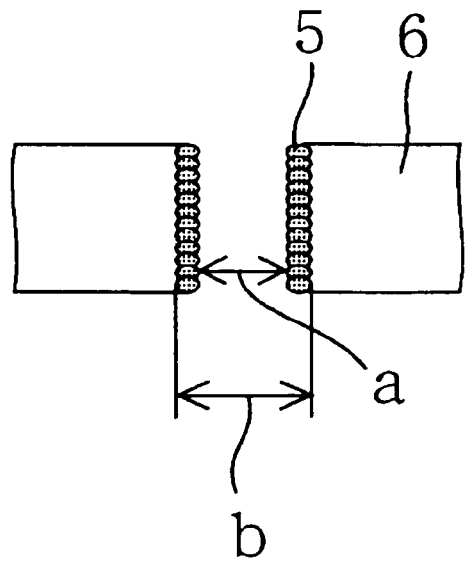
FIG. 3 is a diagram illustrating the relationship between a diameter a of a through-hole and an outer diameter b of a conductive part (electrode).

FIG. 3 is an enlarged cross-sectional view of one conductive part of FIG. 2, and a represents the diameter of a through hole and b represents the diameter (outer diameter) of the conductive part (electrode) formed by adhering conductive metal particles. The diameter b of the conductive part is greater than the diameter a of the through hole because the conductive metal particles adhere in a state in which they have infiltrated somewhat into the porous structure in the wall of the through hole.

Preferably, the anisotropic conductive film of the present invention has a high resistance value of the conductive part under the condition in which no compressive load is applied thereto and has a resistance value of the conductive part equal to or less than 0.5Ω when a predetermined compressive load is applied. The measurement of the resistance value of conductive parts is done using the conduction confirmation equipment shown in FIG. 5 and the details will be described in the section of Example.

It is difficult to adhere conductive metal only to the walls of the through holes by an electroless plating method or the like if through holes are provided simply at plural positions in the porous film as shown in FIG. 1. For example, when a porous PTFE film is used as the porous film, conductive metal particles will be deposited on the whole resinous parts of porous structure in addition to the walls of the through holes. In the present invention, therefore, using a mask layer, for example, is recommendable as a method of adhering conductive metal only to the walls of the through holes. More specifically, in order to cause conductive metal to adhere only to the walls of the through holes, mask layers are formed on both surfaces of a base film so that no catalytic particles for facilitating chemical reduction reaction in electroless plating may adhere to the surfaces of the base film.

For example, when a porous PTFE film made by the expansion method is used as the base film, preferably a polytetrafluoroethylene film, which is the same material as the base film, is used as the mask layer material because not only is the stickability thereof with the base film good, allowing simultaneous formation of through holes with the base film, but also delamination thereof with the base film can be easily done upon ending of its role as the mask layer. Also, more preferably the mask layer should be made of a porous PTFE film from the viewpoints of enhancing the etching rate for forming through holes and facilitating delamination with the base film upon ending of its role as the mask layer. The porous PTFE film as the mask layer preferably has a porosity of about 20-80% from the viewpoint of ease in peeling-off operation, and the film thickness thereof is preferably equal to or less than 3 mm, more preferably equal to or less than 1 mm, and most preferably equal to or less than 100 μm. Also, the mean hole diameter thereof is preferably equal to or less than 10 μm (or the bubble point thereof is equal to or more than 2 kPa) from the viewpoint of waterproof property as the mask layer.

Figure 4:
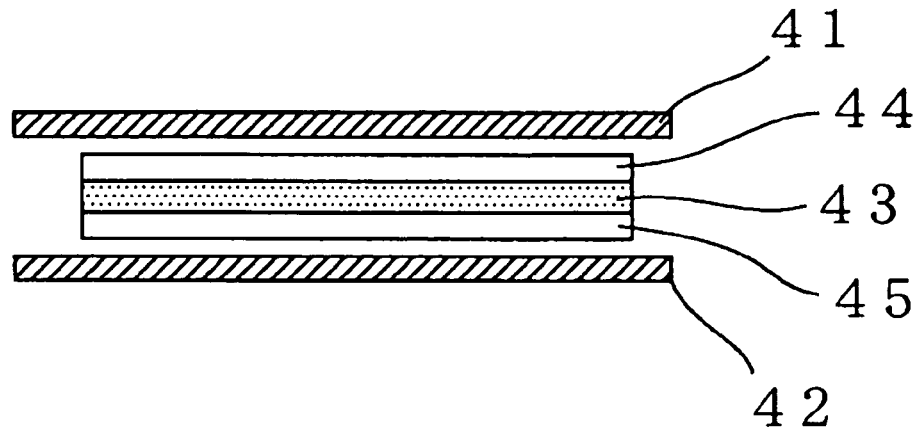
FIG. 4 is a sectional view illustrating a manufacturing process of a laminated body the central layer of which is a base film.

An example in which a porous PTFE film (A) obtained by the expansion method is used as a base film and polytetrafluoroethylene films of the same material, preferably porous PTFE films (B) and (C), are used as mask layers will be described in reference to FIG. 4. A three layer laminated body is formed by fusion-bonding porous PTFE films (B) 44 and (C) 45 as the mask layers to both faces of the base film consisting of a porous PTFE film (A) 43 as shown in FIG. 4. More concretely, these porous PTFE films are stacked in three layers as shown in FIG. 4, and both faces of the stacked layers are sandwiched between two sheets of stainless boards 41 and 42. Each stainless board has parallel surfaces. By heating each stainless board for 30 minutes or more at a temperature of 320-380° C., three layers of porous PTFE films are melt and bonded with one another. Preferably, quenching is performed using cooling water or the like to enhance the mechanical strength of the porous PTFE films after the heat treatment. Thus, a three-layer laminated body is formed.

As for the method of forming through holes in the film thickness direction at specific positions of the porous film, there are methods such as a chemical etching method, a pyrolysis method, an abrasion method using laser beams or soft X-ray irradiation, an ultrasonic wave method, for example. When a porous PTFE film made by the expansion method is used as the base film, preferable methods are the ultrasonic wave method and a method in which synchrotron radiation rays or laser beams with a wavelength of 250 nm or less are irradiated.

The method of manufacturing an anisotropic conductive film using a porous PTFE film as a base film and including a step of forming through holes by the irradiation of synchrotron radiation rays or laser beams with a wavelength equal to or less than 250 nm preferably comprises: (1) a step of forming a three layer laminated body by fusion-bonding polytetrafluoroethylene films (B) and (C) as mask layers to both surfaces of the base film consisting of a porous polytetrafluoroethylene film (A); (2) a step of forming through-holes in a pattern in the laminated body by irradiating the surface of one of the mask layers with synchrotron radiation rays or laser beams having a wavelength of 250 nm or less through a light shielding sheet having a plurality of optically transparent parts provided independently of each other in a pre-determined pattern; (3) a step of adhering catalytic particles for facilitating chemical reduction reaction to the whole surface, including the wall surfaces of the through-holes, of the laminated body; (4) a step of peeling off the mask layers from both surfaces of the base film; and (5) a step of adhering conductive metal by electroless plating to the wall surfaces of the through-holes in the resinous part having porous structure.

As for the light shielding sheet, for example, a tungsten sheet is preferably used. In the tungsten sheet, a plurality of openings are formed in a pattern, and the openings are used as optically transparent parts (hereinafter, sometimes simply referred to as "opening"). The parts irradiated by light penetrating through the plurality of openings of the light shielding sheet are subjected to etching so that through holes are formed.

The pattern of the openings of light shielding sheet may be any arbitrary shapes such as a circular form, stellar form, octagon, hexagonal shape, square, or triangle. The size of the opening is sufficient if one side or the diameter has a length equal to or more than 0.1 μm and if it is greater than the mean hole diameter of the porous PTFE film to be used. Since the diameter of the through hole determines the size of the conductive part (electrode) of the anisotropic conductive film, it may be formed appropriately according to the size of the conductive part to be prepared. However, in the case where the anisotropic conductive film is used as an interposer for a burn-in test of semiconductor wafers, the opening size is preferably 5-100 μm, and more preferably 5-30 μm. The pitch between the conductive parts (electrodes) is preferably 5-100 μm.

Figure 10:
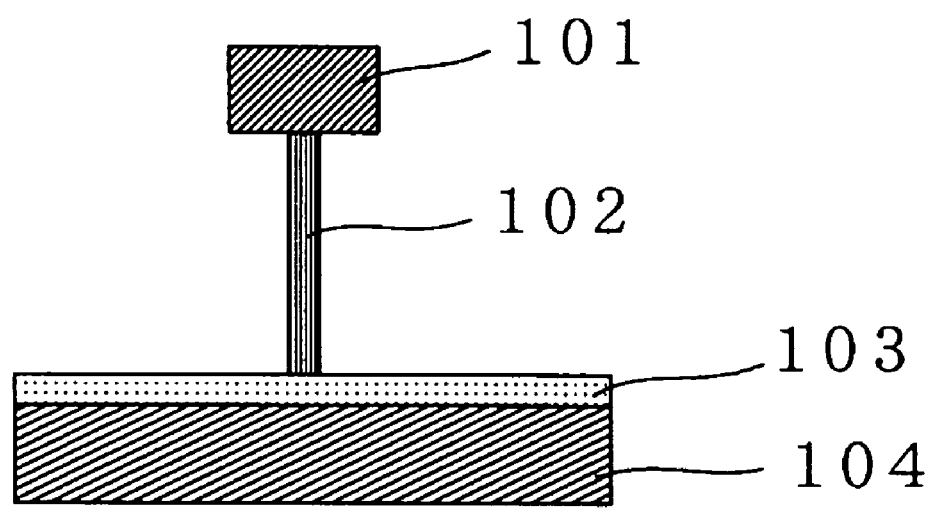
FIG. 10 is a schematic diagram illustrating a method of forming a through-hole in a porous film by using an ultrasonic wave method.

In order to form through holes by the ultrasonic wave method in the film thickness direction at specific positions of the porous film, ultrasonic wave energy is applied to the surface of porous film 103 by pressing it with the tip of a rod 102 using an ultrasonic head 101 having at least one rod 102 at the tip part thereof as shown in FIG. 10. In the step of forming through holes, the porous film 103 is placed on a board-shaped body 104 made of a hard material, such as silicon, ceramics, glass, or the like, for example. Instead of using such a board-shaped body, rods may be disposed in a manner opposing each other on and under the porous film.

As for the rod, a stick-shaped body made of an inorganic material such as metal, ceramics, glass or the like is preferably used. The diameter of the rod is generally selected from a range of 0.05-0.5 mm, although not limited thereto, from the viewpoints of the strength of the rod, workability, and the desired diameter of a through hole to be made. The sectional shape of the rod is generally circular but may be other arbitrary shape such as a stellar form, octagon, hexagon, square, triangle, and so on. Instead of attaching only one rod 102 in the tip part of the ultrasonic head 101, a plurality of rods may be provided so that a number of openings may be formed by batch processing in the porous film.

The pressing pressure of the rod 102 is usually in a range of 1 gf-1 kgf per rod and preferably in a range of 1-100 gf per rod. The frequency of the ultrasonic wave is generally in a range of 5-500 kHz and preferably in a range of 10-50 kHz. The output of the ultrasonic wave is generally in a range of 1-100 W per rod and preferably in a range of 5-50 W per rod.

If the rod 102 is pressed onto the surface of the porous film 103 and the ultrasonic head is operated, the ultrasonic wave energy is applied only at and near the part where the tip of the rod is pressed on the porous film and the vibration energy by the ultrasonic wave causes the temperature to increase locally at such part, whereby the resin component in the part dissolves due to melt, evaporation, etc. and consequently s through hole is formed in the porous film.

Generally, it is difficult to form through holes by machining in a porous PTFE film. For example, if through holes are formed in the porous PTFE film by an ordinary punching method, irregularities occur such that formation of through holes having clean and precise shapes is difficult. On the other hand, if the above-mentioned ultrasonic wave method is used, through holes having desired shapes can be formed easily at low cost in the porous PTFE film.

The sectional shape of the through hole may be an arbitrary shape such as a circular, stellar form, octagon, hexagon, square, triangle, etc. It is possible to make the through hole diameter generally about 5-100 μm, and preferably about 5-30 μm, in the field where a small diameter is suitable. On the other hand, in the field where a large diameter is suitable, it is possible to make the through hole diameter generally about 100-1000 μm, and preferably about 300-800 μm.

The method of manufacturing an anisotropic conductive film, wherein a porous PTFE film is used as a base film and through holes are formed in the film thickness direction at specific positions of the porous film by the ultrasonic wave method, preferably comprises: (I) a step of forming a three layer laminated body by fusion-bonding polytetrafluoroethylene films (B) and (C) as mask layers to both surfaces of a base film consisting of a porous polytetrafluoroethylene film (A);

(II) a step of forming through-holes in a pattern in the laminated body by using an ultrasonic head having at least one rod at the tip thereof and pressing the surface of the laminated body with the tip of the rod so as to apply ultrasonic wave energy thereto;

(III) a step of adhering catalytic particles for facilitating chemical reduction reaction to the whole surface, including the wall surfaces of the through-holes, of the laminated body;

(IV) a step of peeling off the mask layers from both surfaces of the base film; and (V) a step of adhering conductive metal by electroless plating to the wall surfaces of the through-holes in the resinous part having porous structure.

Another preferable method of manufacturing an anisotropic conductive film which method includes a step of using a porous PTFE film as a base film and forming through holes in the film thickness direction at specific positions of the porous film by the ultrasonic wave method comprises: for example, (i) a step of forming a three layer laminated body by fusion-bonding porous polytetrafluoroethylene films (B) and (C) as mask layers to both surfaces of a base film consisting of a porous polytetrafluoroethylene film (A); (ii) a step of infiltrating liquid into porous parts of the laminated body and freezing the liquid; (iii) a step of forming through-holes in a pattern in the laminated body by using an ultrasonic head having at least one rod at the tip thereof and pressing the surface of the laminated body with the tip of the rod so as to apply ultrasonic wave energy thereto; (iv) a step of returning the freezing in the porous parts to liquid by increasing the temperature of the laminated body and removing the liquid; (v) a step of adhering catalytic particles for facilitating chemical reduction reaction to the whole surface, including the wall surfaces of the through holes, of the laminated body; (vi) a step of peeling off the mask layers from both surfaces of the base film; and (vii) a step of adhering conductive metal by electroless plating to the wall surfaces of the through-holes in the resinous part having porous structure.

In the case where the three layer laminated body is used, in the method of forming through holes as shown in FIG. 10, ultrasonic wave energy is applied onto the surface of the laminated body (generally, a three layered porous PTFE film) 103 by pressing it with the tip of the rod 102 using the ultrasonic head 101 in the tip part of which at least one rod 102 is provided.

In the manufacturing method which includes a step of infiltrating liquid into porous parts of the laminated body and freezing the liquid, the liquid such as an organic solvent of water or alcohol (for example, lower alcohol such as methanol, ethanol, isopropanol, etc.) is infiltrated into porous parts of the laminated body which consists of a three layered porous PTFE film and the liquid is frozen by cooling. While the infiltrated liquid is in the frozen condition, ultrasonic wave energy is applied onto the surface of the laminated body using the ultrasonic head having at least one rod in the tip part, whereby processability is improved and through holes having a neat pattern can be formed. In the case of using water as the liquid, if it is frozen by a cooling temperature of zero degree or lower, preferably −10° C. or lower, the processability becomes good. In the case of organic solvent such as alcohol, if it is cooled to −50° C. or lower, or desirably to the liquid-nitrogen temperature, processability becomes good. The organic solvent is preferably liquid of a normal temperature. The organic solvent such as alcohol may be mixtures of two or more kinds or may contain water.

As for the method of making the electrically insulative porous film to be conductive, among methods such as sputtering, ion plating, electroless plating, etc., the electroless plating method is preferable for depositing and adhering conductive metal to the resinous parts of porous structure. In the electroless plating method, generally the catalyst for facilitating chemical reduction reaction must be provided onto the part to which plating is to be applied. For plating only at the resinous parts of porous structure existing in specific positions of the porous film, the method of proving a catalyst only to the relevant parts is effective.

For example, in the case where conductiveness is afforded by electroless copper plating only to wall surfaces (hole walls) of minute through holes formed in the film thickness direction in an arbitrary shape in a porous PTFE film, through holes are formed in the three-layer fusion-bonded laminated body including mask layers formed therein, and the laminated body is immersed in a palladium-tin colloidal catalyst solution while the solution is sufficiently stirred. When the mask layers (B) and (C) are peeled off from both surfaces after such immersion in the catalyst-added solution, a porous PTFE film (A) in which catalytic colloidal particles are adhered only to the wall surfaces of the through holes can be obtained. By immersing the porous PTFE film (A) in a plating solution, it is possible to deposit copper only on the wall surfaces of the through holes, thereby forming pipe-shaped conductive parts (electrodes). When particularly high conductiveness is necessary, it is preferable to use copper, although the conductive parts can be formed by the similar method from other materials than copper, that is, from materials such as nickel, silver, gold, nickel alloy, etc. For forming through holes in the three-layer laminated body, it is preferable to adopt an ultrasonic wave method and a method using irradiation of synchrotron radiation rays or laser beams equal to or less than 250 mm.

Since plating particles (crystal grains) deposit, entangledly in the beginning, onto fine fibers (fibrils) exposed at the wall surfaces of the through holes of porous PTFE film, it is possible to control the adhesion condition of conductive metal by controlling the plating time. If the electroless plating time is too short, it is difficult to obtain conductiveness in the film thickness direction. If the electroless plating time is too long, the conductive metal turns into a metallic solid mass without becoming porous, and consequently it becomes difficult to achieve elastic recovery at compressive load of usual use. By adjusting the plating to a suitable amount, a conductive metal layer having a porous structure can be formed, allowing elasticity as well as conductiveness in the film thickness direction.

As to the pipe-shaped conductive parts (electrodes) formed as described above, it is preferable that an antioxidant be used or covering be provided with precious metal or precious metal alloy beforehand in order to enhance the prevention of oxidation and the electrical contact property. Preferably, the precious metals are palladium, rhodium, and gold in view of low electric resistance. The thickness of the covering layer of precious metal is preferably 0.005-0.5 $\mu$m, and more preferably 0.01-0.1 $\mu$m. If the thickness of the covering layer is too thin, the improvement thereby made in the electrical contact property is less effective, and if it is too thick, the covering layer tends to delaminate. Neither cases are preferable. For example, in order to cover a conductive part with gold it is effective to coat the conductive metal layer with nickel of about 8 nm in thickness and to perform replacement plating with gold.

EXAMPLES

Examples and Comparative Examples are described below so that the present invention is more specifically explained. However, the present invention is not limited to these Examples.

(1) Bubble Point (BP):

The bubble point of a porous PTFE film made by the expansion method was measured using isopropyl-alcohol according to ASTM-F-316-76.

(2) Porosity:

The porosity of the porous PTFE film made by the expansion method was measured according to ASTM D-792.

Figure 5:
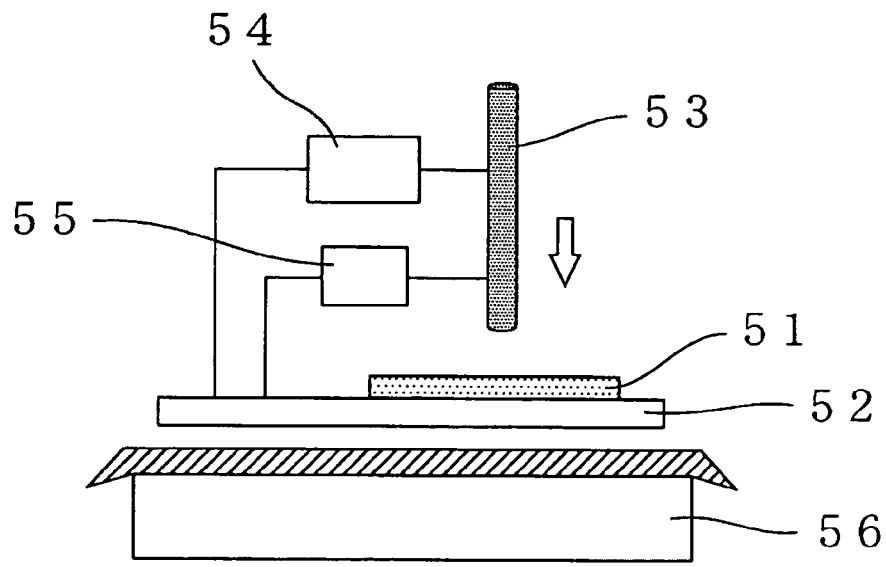
FIG. 5 is a sectional outline view of a conduction confirmation equipment for inspection of the anisotropic conductive film.
Figure 6:
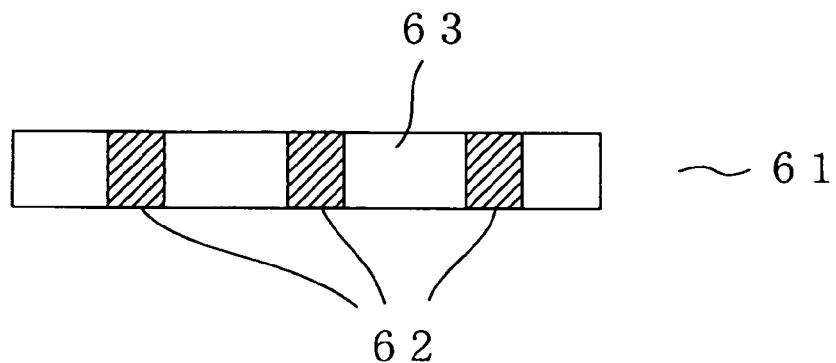
FIG. 6 is a sectional view illustrating an example of a conventional anisotropic conductive film.
Figure 7:
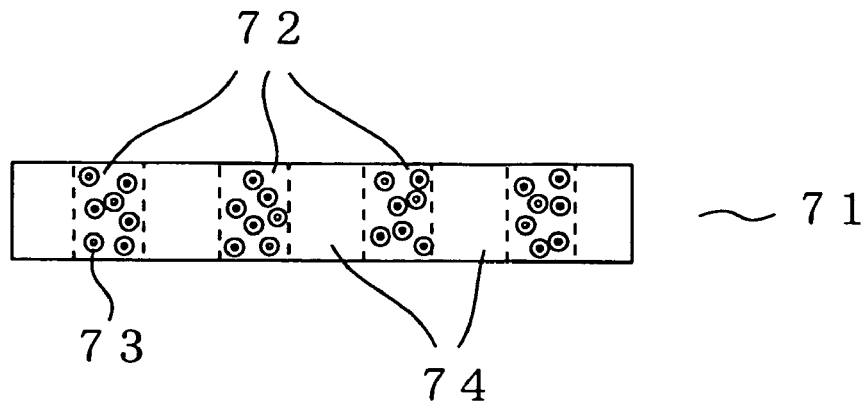
FIG. 7 is a sectional view illustrating another example of a conventional anisotropic conductive film.

(3) Load with which Conduction was Commenced:

Using the conduction confirmation equipment shown in FIG. 5, the conduction commencement load of an anisotropic conductive film was measured. In the conduction confirmation equipment shown in FIG. 5, an anisotropic conductive film 51 was placed on a copper sheet (hereinafter called "Au board") 52 having a gold plating thereon, and they were put on a weight meter 56. A copper pillar 53 having an outer diameter of 3 mm$\phi$ was used as a probe and a load was applied. The resistance value of the anisotropic conductive film was measured by a four-point probe method. The pressing load pressure was calculated from the load which showed a load equal to or less than 0.5$\Omega$ and was defined as a conduction commencement load pressure. In FIG. 5, 54 represents a constant current supply and 55 represents a voltmeter.

(4) Times of Conduction Tests:

An anisotropic conductive film was cut to obtain 5-mm square samples. The elastic recovery performance was evaluated by a penetration method using TMA/SS120C made by Seiko Instruments Inc. and pressing a piece of quartz of 3 mm$\phi$ as a probe under a normal temperature and nitrogen gas atmosphere. Weight loading and non-loading were repeated 10 times at a load with which the strain of film thickness became 38% so that each anisotropic conductive film exhibit conduction, and thereafter conduction test was performed again under a varied film thickness and the conduction commencement load.

Example 1

Three sheets of porous PTFE films made by an expansion method and having an area of 10 cm square, a porosity of 60%, a mean hole diameter of 0.1 $\mu$m (BP=150 kPa), and a film thickness of 30 $\mu$m were laminated and put between two stainless boards having a thickness of 3 mm, a longitudinal length of 150 mm and a width of 100 mm, and they were subjected to heat treatment at a temperature of 350° C. for 30 minutes under the load of the stainless board. After the heating, they were subjected to quenching by water provided on the stainless board so that a fusion-bonded three layer laminated body of porous PTFE film was obtained.

Subsequently, a tungsten sheet, in which openings were formed at uniform sequences by an opening area ratio of 9%, at an opening diameter of 15 $\mu$m$\phi$, and at a pitch of 80 $\mu$m, was placed on one side of the laminated body and an irradiation of synchrotron radiation rays was performed so that through holes were formed in the film thickness direction and equally arranged at a hole diameter of 15 $\mu$m$\phi$ and at pitches of 80 $\mu$m.

The laminated body having the through holes of 15 $\mu$m$\phi$ was immersed in ethanol for one minute so as to be hydrophilic and subsequently immersed for 4 minutes at a temperature of 60° C. in Melplate PC-321 made by Meltex Inc., which was diluted to 100 ml/L, so that degreasing was performed. Furthermore, the laminated body was immersed in 10% sulfuric acid for one minute and subsequently immersed as a predip for two minutes in a solution prepared by dissolving Enplate PC-236 made by Meltex Inc. in 0.8% hydrochloric acid at the ratio of 180 g/L.

Moreover, the laminated body was immersed for 5 minutes in a solution which was prepared by dissolving, at a ratio of 150 g/L, Enplate PC-236 made by Meltex Inc., in a solution which was prepared by dissolving Enplate activator 444 made by Meltex Inc. by 3%, Enplate activator additive by 1%, and hydrochloric acid by 3%, so that catalytic particles were adhered to the surface of the laminated body and the wall surfaces of the through holes. Subsequently, the laminated body was immersed for 5 minutes in a 5% solution of Enplate PA-360 made by Meltex Inc. so that the activation of a palladium catalyst nucleus was accomplished. Thereafter, the mask layers consisting of the first and third layers were peeled off and thereby a porous PTFE film (base film) in which catalyst palladium particles were adhered only to the wall surfaces of the through holes was obtained.

The above-mentioned base film was immersed for 20 minutes, while stirring was done sufficiently by air agitation, in an electroless copper plating solution made with initial compositions of an electroless bath including Melplate Cu-3000A, Melplate Cu-3000B, Melplate Cu-3000C, and Melplate Cu-3000D, respectively at a ratio of 5 volume %, and Melplate Cu stabilizer at 0.1 volume % so that only the wall surfaces of through holes of 15 μmφ were made electrically conductive with copper particles (the outer diameter of an electrode=25 μm). Moreover, the base film was immersed for 30 seconds in a solution made with initial composition of electroless bath with 5 ml/L of Entec Cu-56 made by Meltex Inc. so that an antirust treatment was performed, and an anisotropic conductive film using a porous PTFE film as the base film was obtained.

In the plating process, after each immersion in a solution except for between the pre-dip step of the electroless steel plating and the step of adding a catalyst, water washing was performed using distilled water for about 30 seconds to one minute. The temperatures of the respective solutions were all normal temperatures (20-30° C.) except for the degreasing treatment.

The anisotropic conductive film using a porous PTFE film as the base film, which was prepared as mentioned above, was cut into pieces of 10 mm square, and they were measured in terms of conduction commencement load with the equipment shown in FIG. 5. A resistance value was measured by the four-point probe method using a probe made of copper pillar of 3 mmφ. The pressing load calculated from the load with which the resistance value became equal to or less than 0.5Ω was defined as a conduction commencement load pressure. As a result, the conduction commencement load pressure was 6 kPa.

Also, the anisotropic conductive film was cut off into a 5 mm square piece, and the elastic recovery performance was evaluated by a penetration method using TMA/SS 120C made by Seiko Instruments Inc. and a probe made of quartz of 3 mmφ under a nitrogen gas atmosphere at normal temperature. Weight loading and non-weight loading were repeated 10 times and film thickness displacement and conduction of film thickness direction were examined at each time. As described above, if a resistance value was equal to or less than 0.5Ω, it was considered as conductive. As a result, the conduction commencement load pressure was 6 kPa. Even after weight loading non-weight loading were repeated 10 times with the load of 27.7 kPa, with which the strain of film thickness became 38% and sufficient conduction was obtained, the film thickness during non-weighting loading was substantially the same as before the examination test, and the accomplishment of conduction was proved at the conduction commencement load pressure of 6 kPa.

Example 2

A laminated body was formed by fusion-bonding three porous PTFE films in the same method and conditions as Example 1. Through holes of 10 μmφ were formed in the laminated body, and a pre-treatment for plating was performed. After the delamination of mask layers, a base film was immersed for 20 minutes in an electroless copper plating solution while the solution was stirred sufficiently by air agitation, and copper particles were adhered only to the wall surfaces of the through holes of 10 μmφ so that conductiveness was afforded (the outer diameter of an electrode=17 μm). Subsequently, the same antirust treatment as in Example 1 was performed. Thus, an anisotropic conductive film including the base film that was a porous PTFE film made by the expansion method was obtained. When the same test as Example 1 was performed using the anisotropic conductive film, the conduction commencement load pressure was 6 kPa. After weight loading and non-weight loading were repeated 10 times with the load pressure of 27.7 kPa, with which sufficient conduction was obtained and the strain of film thickness became 38%, the film thickness during non-weight loading was substantially the same as before the examination, and conduction was confirmed to be accomplished at the conduction commencement load pressure of 6 kPa.

Comparative Example 1

Three porous PTFE films made by the expansion method and having an area of 10 cm square, a porosity of 60%, a mean hole diameter of 0.1 μm (BP=150 kPa), and a film thickness of 30 μm were laminated together. The laminated porous PTFE films were put between two stainless boards having a thickness of 3 mm, a longitudinal length of 150 mm and a width of 100 mm, and a heat treatment was performed at 350° C. for 30 minutes under the load of the stainless board. After heating, quenching was done with water provided on the stainless boards, whereby the three laminated porous PTFE films were fusion-bonded, resulting in a laminated body.

Subsequently, a tungsten sheet having openings, each diameter of which was 25 μmφ and which were provided at equal sequences of 60 μm pitch at an open area ratio of 9%, was placed on one face of the laminated body, and synchrotron radiation rays were irradiated so that through holes having a diameter of 25 μmφ and arranged equally at a pitch of 60 μm were formed in the film thickness direction.

After the laminated body having the holes of 25 μmφ thus formed was immersed for one minute in ethanol so as to be hydrophilic, it was immersed for 4 minutes at a water temperature of 60° C. in Melplate PC-321 made by Meltex Inc. which was diluted to 100 ml/L, whereby degreasing treatment was performed. Moreover, the laminated body was immersed for one minute in 10% sulfuric acid, and thereafter it was immersed as a pre dip for two minutes in a solution which was prepared by dissolving Enplate PC-236 made by Meltex Inc. in 0.8% hydrochloric acid at the ratio of 180 g/L.

Subsequently, the laminated body was immersed for five minutes in a solution which was prepared by dissolving Enplate PC-236 made by Meltex Inc. at the ratio of 150 g/L in a solution including Enplate activator 444 made by Meltex Inc., Enplate activator additive, and hydrochloric acid at the ratio of 3%, 1% and 3%, respectively. Consequently, catalytic particles were adhered to the surface of the laminated body and the wall surfaces of the through holes. Moreover, the laminated body was immersed for two minutes in a 5% solution of Enplate PA-360 made by Meltex Inc. so that the activation of palladium catalyst nucleus was performed.

The above-mentioned base film was immersed for five minutes, while stirring was done sufficiently by air agitation, in an electroless copper plating solution made with initial compositions of electroless bath including Melplate Cu-3000A, Melplate Cu-3000B, Melplate Cu-3000C, and Melplate Cu-3000D, respectively at a ratio of 5 volume %, and Melplate Cu stabilizer at 0.1 volume % so that the wall surfaces of the through holes were made electrically conductive with copper particles.

Subsequently, the through holes were filled with copper by electric copper plating using the Copper-Cream CLX made by Meltex Inc. as the electric copper plating solution and at electric current density of 2 A/dm² for 30 minutes. The excessive plating to the mask surface was subjected to etching by immersion in a 10% sulfuric acid solution until the surface of the mask layer could be seen by naked eye, and thereafter the mask layers were peeled off by hand in order to obtain an anisotropic conductive film which had conductiveness only in the film thickness direction with electrodes having an outer diameter of 25 μmφ that exhibit conduction in the film thickness direction and which had protuberant electrodes of 7 μm on the film surfaces.

The anisotropic conductive film thus obtained was immersed for 30 seconds in a bath made with initial composition of 5 ml/L of Entec Cu-56 made by Meltex Inc., whereby an antirust treatment was performed. Thus, an anisotropic conductive film which has a base film made of a porous PTFE film prepared by the expansion method and each through hole of which was filled with conductive metal.

In the plating process, after each immersion in the respective solution except for between the pre-dip step of the electroless copper plating and the step of adding a catalyst, water washing was performed using distilled water for about 30 seconds to one minute. The temperatures of the respective solutions were all normal temperatures (20-30° C.) except for the degreasing treatment.

Figure 8:
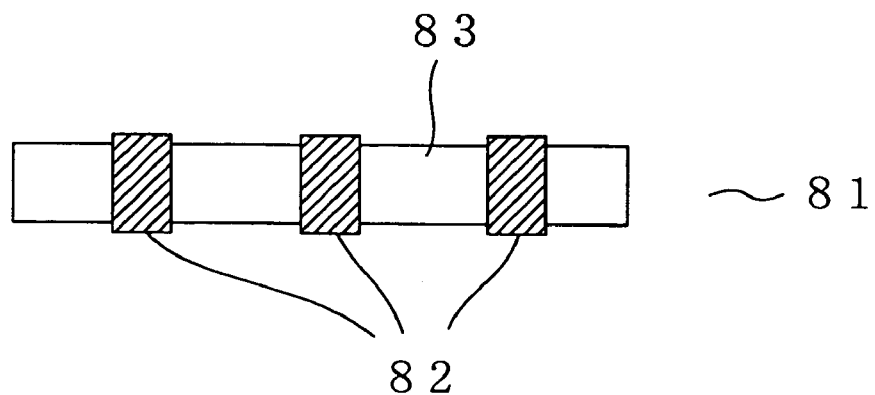
FIG. 8 is a sectional view of an anisotropic conductive sheet made in Comparative Example 1.

Thus, as shown in FIG. 8, an anisotropic conductive film 81 was obtained in which a porous PTFE film 83 was used as a base film and which had conductive parts (electrodes) 82 each having a protuberance on both faces of the conductive film and made by filling conductive metal in each through hole. When a similar test was performed as in Example 1 using the anisotropic conductive film, the conduction commencement load pressure was 3 kPa. After weight loading and non-weight loading were repeated 10 times with the load pressure of 37.0 kPa with which sufficient conduction was obtained and with which the strain of film thickness became 38%, the film thickness decreased by 6.1 μm and no conduction was obtained with the conduction commencement load pressure of 3 kPa.

Comparative Example 2

Nickel particles (made by Nippon Atomized Metal Powders Corporation, average particle diameter: 10 μm) were mixed, so as to be 80 volume %, with silicone rubber (additive-type RTV rubber KE1206 made by Shin-Etsu Polymer Co. Ltd., to which a predetermined amount of cross-linking agent was added) at room temperature. The compound thus made was shaped with a doctor knife having 25 μm gap on a glass board and subsequently hardened for one hour in a constant temperature oven of 80° C. In this manner, an anisotropic conductive film of about 22 μm in thickness, in which metal particles were dispersed in the silicon elastomer, was obtained.

Figure 9:
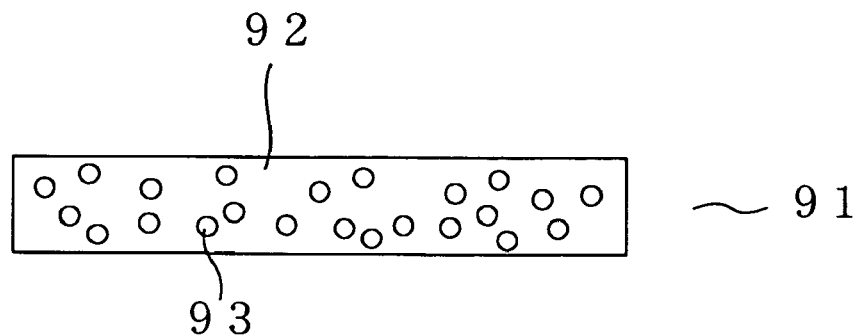
FIG. 9 is a sectional view of an anisotropic conductive sheet made in Comparative Example 2.

An anisotropic conductive film 91 thus obtained had a structure in which electrically conductive particles 93 were dispersed in a base film 92 made of silicone rubber as shown in FIG. 9. When a similar test as in Example 1 was performed with respect to the anisotropic conductive film, the conduction commencement load pressure was 25 kPa. After weight loading and non-weight loading were repeated 10 times with the load pressure of 28.0 kPa with which sufficient conduction was obtained and with which the strain of film thickness became 38%, the film thickness decreased by 0.7 μm and no conduction was obtained with the conduction commencement load pressure of 25 kPa.

TABLE 1

|  | Example 1 | Example 2 | Comparative 1 | Comparative 2 |
|---|---|---|---|---|
| Base film | Porous PTFE film | Porous PTFE film | Porous PTFE film | Silicone rubber |
| Throughhole diameter [μm] | 15 | 10 | 25 | Nil |
| Film thickness [μm] | 30 | 30 | 44 | 22 |
| Condition of metal | Deposited on wall surfaces of through holes | Deposited on wall surfaces of through holes | Filled in porous structure of particular positions | Metal particles were dispersed in elastomer |
| Electrode diameter [μm] | 25 | 17 | 25 | Nil |
| Distance between electrodes [μm] | 80 | 60 | 80 | Nil |
| Kind of metal | Cu | Cu | Cu | Ni |
| Conduction commencement load pressure [kPa] | 6 | 6 | 3 | 25 |
| Film thickness decrease [μm] | 0 | 0 | 6.1 | 0.7 |
| Conduction | Accomplished | Accomplished | Nil | Nil |

(Note) The film thickness of Comparative Example 1 includes the protuberance height of the conductive part.

The film thickness decrease means the decreased amount of film thickness measured after the film thickness strain of 38% was applied 10 times. The conduction means conduction evaluated after the film thickness strain of 38% was applied 10 times.

The invention claimed is:

1. A method of making an anisotropic conductive film, wherein conductive parts capable of being afforded with conductiveness respectively in the film thickness direction are provided independently of each other in a piercing manner from a first surface to a second surface by adhering conductive metal to resinous parts having porous structure at plural positions in a base film consisting of a porous polytetrafluoroethylene film, the method comprising the steps of:
(i) forming a three layer laminated body by fusion-bonding polytetrafluoroethylene films (B) and (C) as mask layers to both surfaces of a base film consisting of a porous polytetrafluoroethylene film (A);
(ii) infiltrating liquid into porous parts of the laminated body and freezing the liquid;
(iii) forming through-holes in a pattern in the laminated body by using an ultrasonic head having at least one rod at the tip thereof and pressing the surface of the laminated body with the tip of the rod so as to apply ultrasonic wave energy thereto;
(iv) returning the freezing in the porous parts to liquid by increasing the temperature of the laminated body and removing the liquid;
(v) adhering catalytic particles for facilitating chemical reduction reaction to porous parts existing in the whole surface, including the wall surfaces of the through-holes, of the laminated body;
(vi) peeling off the mask layers from both surfaces of the base film; and
(vii) adhering conductive metal by electroless plating to resinous parts having porous structure on the wall surfaces of the through-holes.

2. A manufacturing method as set forth in claim 1, wherein water or organic solvent is used as the liquid to be infiltrated into the porous parts in the step (ii) above.

* * * * *